(12) United States Patent
Mirgorodski et al.

(10) Patent No.: US 7,042,763 B1
(45) Date of Patent: May 9, 2006

(54) PROGRAMMING METHOD FOR NONVOLATILE MEMORY CELL

(75) Inventors: Yuri Mirgorodski, Sunnyvale, CA (US); Pavel Poplevine, Foster City, CA (US); Peter J. Hopper, San Jose, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 161 days.

(21) Appl. No.: 10/895,711

(22) Filed: Jul. 8, 2004

(51) Int. Cl.
*G11C 11/34* (2006.01)

(52) U.S. Cl. .............................. 365/185.05; 365/185.1; 365/185.14

(58) Field of Classification Search ..................... None
See application file for complete search history.

(56) References Cited

U.S. PATENT DOCUMENTS 6,903,978 B1 * 6/2005 Mirgorodski et al. .. 365/185.28
6,985,386 B1 * 1/2006 Mirgorodski et al. .. 365/185.05
6,992,927 B1 * 1/2006 Poplevine et al. ..... 365/185.05

* cited by examiner

*Primary Examiner*—Amir Zarabian
*Assistant Examiner*—Michael Weinberg
(74) *Attorney, Agent, or Firm*—Vedder Price Kaufman & Kammholz

(57) ABSTRACT

A method of selectively programming nonvolatile memory cells in which multiple programming voltages are used to obtain the desired voltage on the storage nodes of the cells selected for programming, while the storage nodes of unselected cells remain undisturbed.

4 Claims, 6 Drawing Sheets

PROGRAMMING METHOD FOR NONVOLATILE MEMORY CELL

BACKGROUND OF THE INVENTION

1. Field of the Invention

The present invention relates to nonvolatile memory (NVM) cells, and in particular to programming methods for NVM cells.

2. Description of the Related Art

Conventional programming methods for NVM cells based upon P-channel insulated gate field effect transistors (P-IGFETs), such as P-type metal oxide semiconductor field effect transistors (P-MOSFETs), are based upon hot electron injection occurring (with the source electrode grounded) at large negative drain electrode potentials of approximately −5 volts along with a negative gate electrode potential. The injection current has a maximum magnitude with respect to the gate electrode voltage and is smaller at low and large negative gate voltages. Conventional methods bring the floating gate voltage to a low negative value, at which the electron injection begins and produces an increasingly negative value of floating gate voltage, which in turn, produces more electron injections, and so on. This self-supporting mechanism ceases, however, when the floating gate voltage has passed through its maximum value to a negative value where the electron injection becomes negligible. This programming effect is equal to the width of the gate voltage zone where injection is non-negligible, depends on drain voltage, and, as such, is limited (e.g., approximately 2.5 volts).

SUMMARY OF THE INVENTION

In accordance with the presently claimed invention, a method of selectively programming nonvolatile memory cells is provided in which multiple programming voltages are used to obtain the desired voltage on the storage nodes of the cells selected for programming, while the storage nodes of unselected cells remain undisturbed.

In accordance with one embodiment of the presently claimed invention, a method of selectively programming first and second memory cells each of which includes a plurality of P-channel insulated gate field effect transistors (P-IGFETs), each having a gate, a drain, a source and an N-well, wherein each one of the first and second memory cells includes a control P-IGFET with a control electrode connecting its drain, source and N-well, a write P-IGFET with a write electrode connecting its source and N-well, a read P-IGFET with a read electrode connecting its source and N-well, an erase P-IGFET with an erase electrode connecting its drain, source and N-well, and a shared electrode connecting the control, write, read and erase P-IGFET gates, includes:

applying a substantially fixed reference voltage to the control electrodes, the write P-IGFET drains, the write electrodes, the read P-IGFET drains, the read electrodes and the erase electrodes of the first and second memory cells;

applying to at least the write P-IGFET drains, the write electrodes, the read P-IGFET drains, the read electrodes and the erase electrodes of the first and second memory cells a first substantially fixed programming voltage which is more positive than the reference voltage;

applying to the control electrodes of the first and second memory cells a second substantially fixed programming voltage which is more positive than the first substantially fixed programming voltage;

re-applying the substantially fixed reference voltage to the write P-IGFET drain of the first memory cell while continuing the applying of the first substantially fixed programming voltage to the write P-IGFET drain of the second memory cell;

re-applying the first substantially fixed programming voltage to the write P-IGFET drain of the first memory cell;

re-applying the substantially fixed reference voltage to the control electrodes of the first and second memory cells; and re-applying the substantially fixed reference voltage to the write P-IGFET drains, the write electrodes, the read P-IGFET drains, the read electrodes and the erase electrodes of the first and second memory cells.

In accordance with another embodiment of the presently claimed invention, a method of selectively programming first and second memory cells each of which includes a plurality of P-channel insulated gate field effect transistors (P-IGFETs), each having a gate, a drain, a source and an N-well, wherein each one of the first and second memory cells includes a control capacitor with first and second electrodes, a write P-IGFET with a write electrode connecting its source and N-well, a read P-IGFET with a read electrode connecting its source and N-well, an erase P-IGFET with an erase electrode connecting its drain, source and N-well, and a shared electrode connecting the first control capacitor electrode and the write, read and erase P-IGFET gates, includes:

applying a substantially fixed reference voltage to the second control capacitor electrodes, the write P-IGFET drains, the write electrodes, the read P-IGFET drains, the read electrodes and the erase electrodes of the first and second memory cells;

applying to at least the write P-IGFET drains, the write electrodes, the read P-IGFET drains, the read electrodes and the erase electrodes of the first and second memory cells a first substantially fixed programming voltage which is more positive than the reference voltage;

applying to the second control capacitor electrodes of the first and second memory cells a second substantially fixed programming voltage which is more positive than the first substantially fixed programming voltage;

re-applying the substantially fixed reference voltage to the write P-IGFET drain of the first memory cell while continuing the applying of the first substantially fixed programming voltage to the write P-IGFET drain of the second memory cell;

re-applying the first substantially fixed programming voltage to the write P-IGFET drain of the first memory cell;

re-applying the substantially fixed reference voltage to the second control capacitor electrodes of the first and second memory cells; and re-applying the substantially fixed reference voltage to the write P-IGFET drains, the write electrodes, the read P-IGFET drains, the read electrodes and the erase electrodes of the first and second memory cells.

In accordance with still another embodiment of the presently claimed invention, a method of selectively programming first and second memory cells each of which includes a plurality of P-channel insulated gate field effect transistors (P-IGFETs), each having a gate, a drain, a source and an N-well, wherein each one of the first and second memory cells includes a gated diode with a gate, an anode and a cathode, a control P-IGFET with a control electrode connecting its drain, source and N-well, a read P-IGFET with a read electrode connecting its source and N-well, an erase P-IGFET with an erase electrode connecting its drain, source and N-well, and a shared electrode connecting the gated diode gate and the control, read and erase P-IGFET gates, includes:

applying a substantially fixed reference voltage to the control electrodes, the gated diode anodes, the gated diode cathodes, the write electrodes, the read P-IGFET drains, the read electrodes and the erase electrodes of the first and second memory cells;

applying to at least the gated diode anodes, the gated diode cathodes, the read P-IGFET drains, the read electrodes and the erase electrodes of the first and second memory cells a first substantially fixed programming voltage which is more positive than the reference voltage;

applying to the control electrodes of the first and second memory cells a second substantially fixed programming voltage which is more positive than the first substantially fixed programming voltage;

re-applying the substantially fixed reference voltage to the gated diode anode of the first memory cell while continuing the applying of the first substantially fixed programming voltage to the gated diode anode of the second memory cell;

re-applying the first substantially fixed programming voltage to the gated diode anode of the first memory cell;

re-applying the substantially fixed reference voltage to the control electrodes of the first and second memory cells; and re-applying the substantially fixed reference voltage to the gated diode anodes, the gated diode cathodes, the read P-IGFET drains, the read electrodes and the erase electrodes of the first and second memory cells.

In accordance with still another embodiment of the presently claimed invention, a method of selectively programming first and second memory cells each of which includes a plurality of P-channel insulated gate field effect transistors (P-IGFETs), each having a gate, a drain, a source and an N-well, wherein each one of the first and second memory cells includes a control capacitor with first and second electrodes, a gated diode with a gate, an anode and a cathode, a read P-IGFET with a read electrode connecting its source and N-well, an erase P-IGFET with an erase electrode connecting its drain, source and N-well, and a shared electrode connecting the first control capacitor electrode, the gated diode gate, and the read and erase P-IGFET gates, includes:

applying a substantially fixed reference voltage to the second control capacitor electrodes, the gated diode anodes, the gated diode cathodes, the read P-IGFET drains, the read electrodes and the erase electrodes of the first and second memory cells;

applying to at least the gated diode anodes, the gated diode cathodes, the read P-IGFET drains, the read electrodes and the erase electrodes of the first and second memory cells a first substantially fixed programming voltage which is more positive than the reference voltage;

applying to the second control capacitor electrodes of the first and second memory cells a second substantially fixed programming voltage which is more positive than the first substantially fixed programming voltage;

re-applying the substantially fixed reference voltage to the gated diode anode of the first memory cell while continuing the applying of the first substantially fixed programming voltage to the gated diode anode of the second memory cell;

re-applying the first substantially fixed programming voltage to the gated diode anode of the first memory cell;

re-applying the substantially fixed reference voltage to the control electrodes of the first and second memory cells; and re-applying the substantially fixed reference voltage to the gated diode anodes, the gated diode cathodes, the read P-IGFET drains, the read electrodes and the erase electrodes of the first and second memory cells.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

As discussed in more detail below, a method for programming NVM cells in accordance with the presently claimed invention brings the floating gate potential to a negative value below the programming zone, following which the gate voltage is increased in an at least approximately ramped manner. Coupling between the control gate and the floating gate causes the floating gate potential to rise in the programming zone until electron injection current compensates the effect of such coupling. At this point, the floating gate potential may stay as long as the control gate ramps up (e.g., "surfing") on the wave of injection current, with the programming effect limited only by how much control voltage is available. A related programming method is discussed in U.S. patent application Ser. No. 10/664,469, filed on Sep. 17, 2003, the disclosure of which is incorporated herein by reference.

Figure 1:
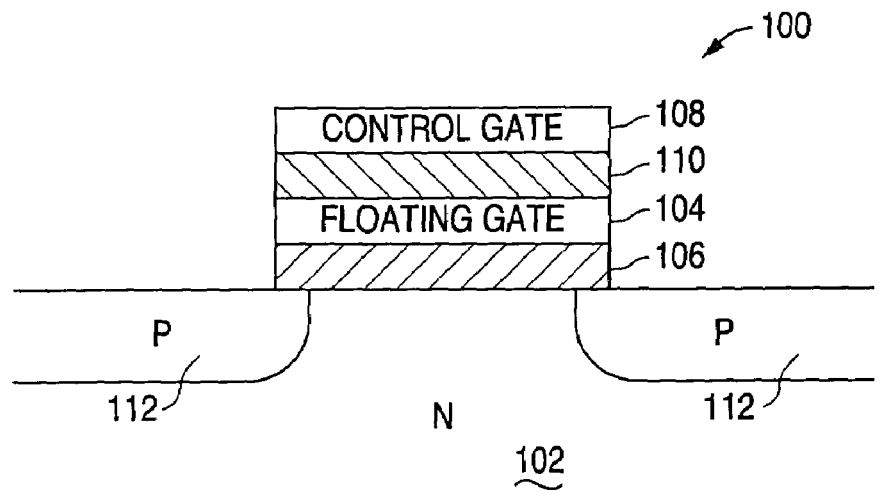
FIG. 1 is a partial cross sectional view of a conventional P-channel insulated gate field effect transistor (P-IGFET) stacked gate NVM cell.

Referring to FIG. 1, a conventional P-IGFET (e.g., P-channel metal oxide semiconductor field effect transistor, or P-MOSFET) stacked gate NVM cell 100 is formed in an N-type region 102 of semiconductor material (e.g., crystalline silicon). As is well known, such N-type region 102 is typically an N-well formed in a P-type silicon substrate. The cell 100 includes a conductive floating gate 104 (e.g., polysilicon) that is separated from the N-type region 102 by a layer of thin gate dielectric material 106 (e.g., silicon dioxide). A control gate electrode 108 (e.g., polysilicon) is separated from the floating gate 104 by a layer of intergate dielectric material 110 (e.g., a sandwich of oxide-nitride-oxide). Two P-type diffusion regions 112 formed at the sides of the stacked gate structure provide the source and drain regions of the cell 100 and define an N-type channel region between them. Fabrication techniques available for making such cells 100 are well known.

As is well known, such a cell uses hot electron injection in a conventional method of programming NVM cells. When applied to such a stacked gate cell 100, the hot electron injection programming method assumes that a high negative voltage is applied to the drain region of the cell 100. Depending upon the erasing and coupling coefficient(s), a corresponding voltage is applied to the control gate 108, thereby bringing the potential of the floating gate 104 to a value that is negative but lower in absolute value as compared with the drain potential. Under such conditions, a high lateral electrical field is generated, thereby creating hot electrons, which are affected by a high perpendicular electrical field such that the hot electrons tunnel through the thin gate oxide 106 to reach the floating gate 104. The amount of injection current depends primarily upon the potentials of the drain region and floating gate electrodes such that with more drain voltage more injection takes place. (Further discussion of such a memory cell and programming technique can be found in U.S. Pat. No. 6,137,723, the disclosure of which is incorporated herein by reference.)

Figure 2:
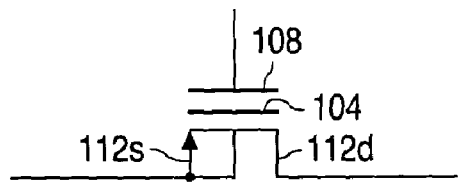
FIG. 2 is a schematic diagram for the NVM cell of FIG. 1.

Referring to FIG. 2, the memory cell 100 of FIG. 1 can be represented in electrical schematic form as shown.

Figure 3:
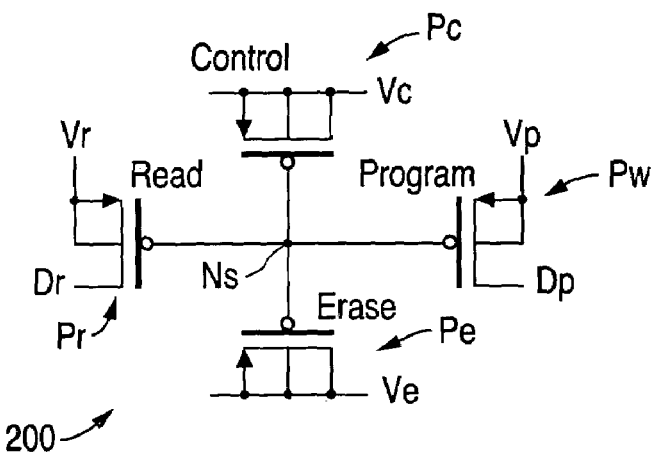
FIG. 3 is a schematic diagram of an alternative NVM cell.

Referring to FIG. 3, an alternative memory cell 200 includes four P-IGFETs, with one transistor for each of the cell functions (programs or write, read, erase and control). Such a cell 200, while being somewhat larger in size or circuit area than a conventional stacked gate cell within an integrated circuit environment, allows for independent and improved optimization of each cell function.

The program, or write, function is controlled by a transistor Pw with interconnected source and bulk regions to which a programming voltage Vp is applied, a drain region to which a programming signal Dp is applied, and a gate electrode connected to the storage node Ns. The read function is controlled by a transistor Pr having interconnected source and bulk regions to which a read voltage Vr is applied, a drain region from which a read signal Dr is received, and a gate electrode connected to the storage node Ns. The erase function is controlled by a transistor Pe having interconnected drain, source and bulk regions to which an erase voltage Ve is applied, and a gate electrode connected to the storage node Ns. The control function is controlled by a transistor Pc having interconnected drain, source and bulk regions to which a control voltage Vc is applied, and a gate electrode connected to the storage node Ns.

Programming such a memory cell 200 in a conventional manner would be as follows. During programming, or writing, a programming voltage Vp (e.g., approximately 5 volts) is applied, with all other electrodes being connected to the circuit reference potential (e.g., ground). During erasing, an erase voltage Ve is applied (e.g., approximately 10 volts), with all other electrodes connected to the circuit reference potential. During reading, a read voltage Vr is applied (e.g., approximately 1 volt), and all other electrodes are connected to the circuit reference potential. (Such voltages are typical for oxide thicknesses in the range of 60–80 Angstroms.)

Figure 4:
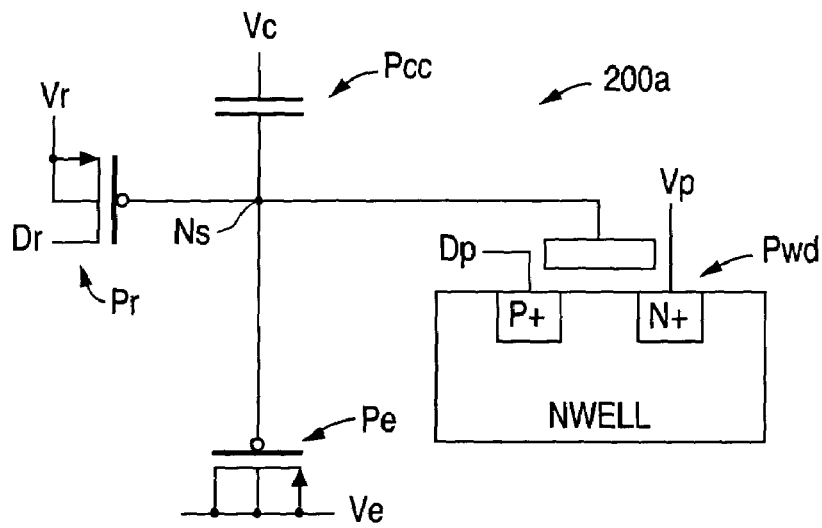
FIG. 4 is a schematic diagram of another alternative NVM cell.

Referring to FIG. 4, another alternative memory cell 200a is similar in design in that four separate devices are used for controlling the four respective functions (program, read, erase, control). However, as can be seen, the device Pcc used for the control function can be a capacitor instead of a transistor. Similarly, the programming, or writing, function can be controlled through the use of a gated diode Pwd instead of a transistor Pw. Hence, with reference to FIGS. 3 and 4, it can be seen that a memory cell in accordance with the presently claimed invention may include four transistors, three transistors and a capacitor, three transistors and a gated diode, or a combination of two transistors, a capacitor and a gated diode.

Figure 5:
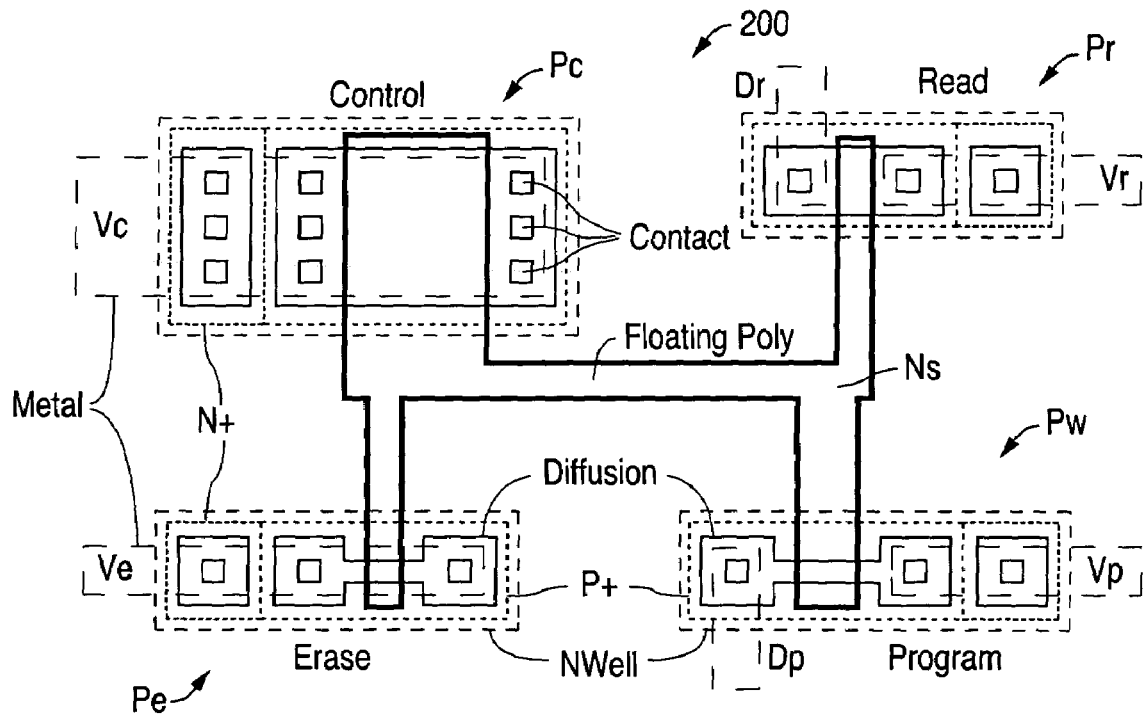
FIG. 5 is a plan view of a portion of an integrated circuit containing a NVM cell in conformance with the schematic diagram of FIG. 3.

Referring to FIG. 5, the design flexibility available with such a memory cell 200 can be better appreciated. For example, larger transistors can be used for the read function, thereby increasing the read signal current and speed. Conversely, a smaller transistor can be used for the programming, or writing, function, thereby reducing programming current and capacitance. Also, using an independent device for the control function allows different voltages to be used for the various functions, thereby allowing for optimization for each function.

Figure 6:
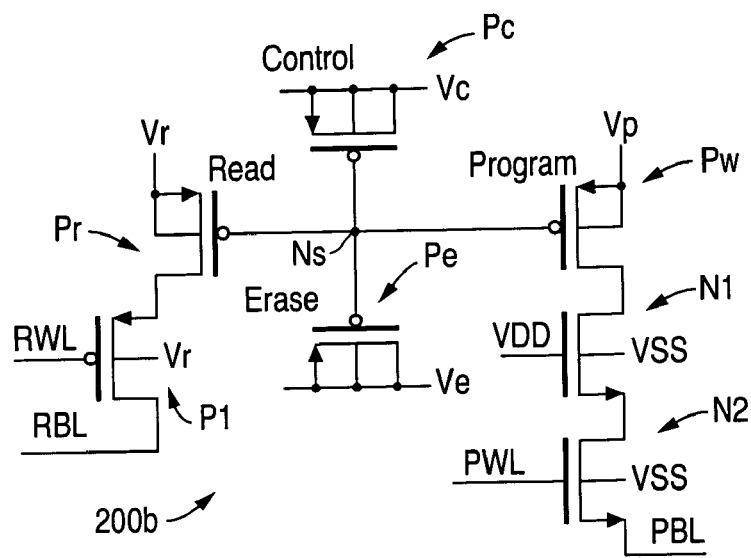
FIG. 6 is a schematic diagram of another alternative NVM cell.

Referring to FIG. 6, another alternative memory cell 200b includes additional transistors P1, N1, N2 for facilitating the use of such a memory cell 200b within an array of such cells. For example, to read data from the storage node Ns, a P-channel pass transistor P1 is used. To program data to the storage node Ns, a cascode circuit of two N-channel pass transistors N1, N2 is used to prevent a high voltage from appearing between a gate electrode and a drain or source region.

Figure 7:
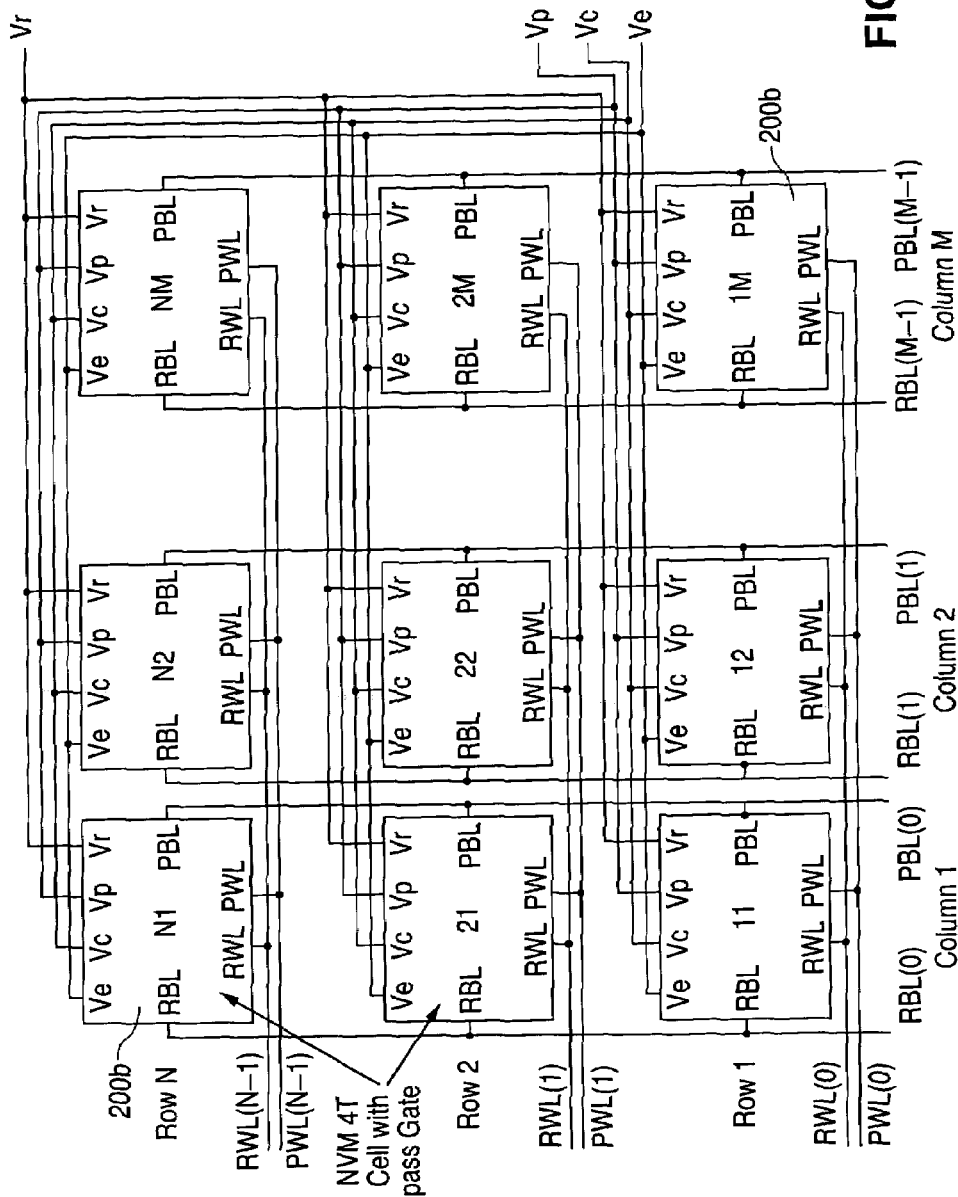
FIG. 7 is a functional block diagram of a NVM cell array composed of a plurality of NVM cells in conformance with the schematic diagram of FIG. 6.

Referring to FIG. 7, the memory cell 200b of FIG. 6 can be incorporated into an array as shown. Such an array has M columns and N rows. The program word line PWL selects the rows to be programmed, while the read word line RWL selects the rows to be read. The erase voltage Ve, program voltage Vp, control voltage Vc and read voltage Vr are applied to each cell directly. With no high voltage switches or other supporting circuitry, significantly simplified connections can be made from the external or internal voltage and signal sources and to the signal destinations.

The operational modes of erase, program and read are similar to those for a single cell. During erase mode, the program word lines PWL(0)–PWL(N−1) are at a logic low, the read word lines RWL(0)–RWL(N−1) are at a logic high, the erase voltage Ve is applied, and the rest of the signal lines are at circuit reference potential. This causes all cells to be erased.

During programming mode, the read word lines RWL(0)–RWL(N−1) are at a logic high, one of the program word lines, e.g., PWL(0), will be at a logic high while the remaining program word lines, e.g., PWL(1)–PWL(N−1), will be at a logic low. To program a particular cell 200b, the corresponding program bit line, e.g., PBL(0), will be at a logic low. To erase the remaining cells 200b, the corresponding program bit lines, e.g., PBL(1)–PBL(M−1), will be left floating. The program voltage Vp is applied to all cells 200b, while the remaining electrodes are at circuit reference potential.

During the read mode of operation, the program word lines PWL(0)–PWL(N–1) are at a logic low, one of the read word lines, e.g., RWL(0), will be at a logic low, while the remaining read word lines, e.g., RWL(1)–RWL(N–1) will be at a logic high. On each of the read bit lines RBL(0)–RBL (M–1) a high current or voltage will be received for each corresponding cell that had been programmed, while a low current or voltage will be received for each corresponding cell that had been erased. The read voltage Vr is applied to all cells 200*b*, while the remaining electrodes are at circuit reference potential.

A programming method in accordance with the presently claimed invention advantageously requires a reduced amount of programming current while still allowing for either an ability to program larger numbers of memory cells at one time or to reduce and simplify the on-chip voltage source needed for programming. A related programming method is discussed in U.S. patent application Ser. No. 10/665,185, filed on Sep. 17, 2003, the disclosure of which is incorporated herein by reference.

In accordance with the presently claimed invention, multiple memory cells, e.g., in an array, undergo programming whereby certain cells are selected for programming while other cells are unselected and inhibited from having their previous programming disturbed. Two programming voltages are used with one being more positive than the other, e.g., a first programming voltage V1 of +5 volts and a second programming voltage V2 of +10 volts.

Figure 8A:
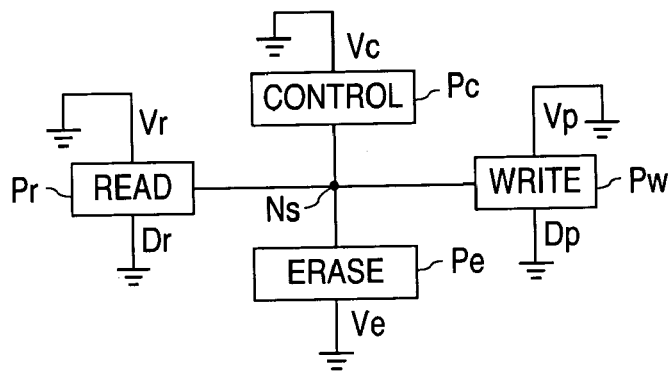
FIGS. 8A–8G illustrate a programming method in accordance with one embodiment of the presently claimed invention for NVM cells implemented in conformance with FIGS. 3 and 4.
Figure 8B:
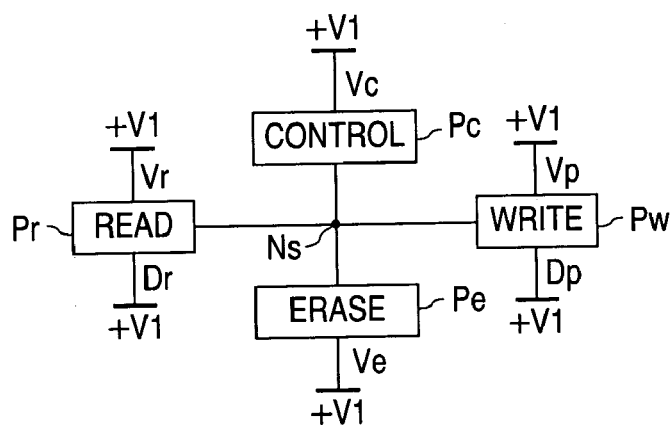

Referring to FIGS. 8A–8G, the programming method is as follows. First, as shown in FIG. 8A, all of the electrodes of the control devices Pw, Pr, Pc, Pe are connected to circuit reference potential, e.g., ground. Second, as shown in FIG. 8B, the lower V1 of the positive programming voltages is applied to all of the electrodes of the control devices, Pw, Pr, Pc, Pe. Alternatively, the control voltage Vc of the control voltage device Pc can be remain at circuit reference potential.

Figure 8C:
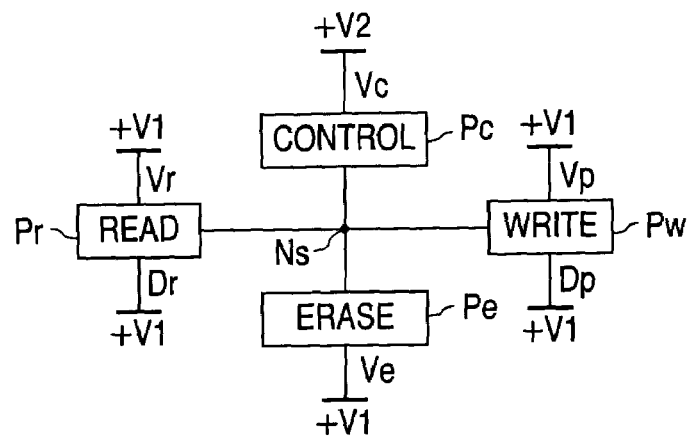
Figure 8D:
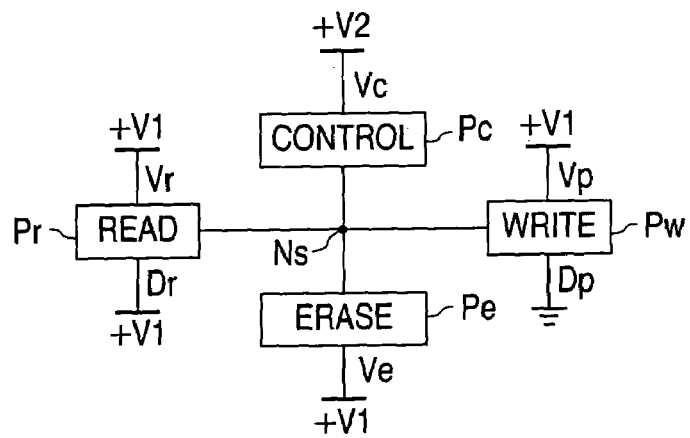

Third, as shown in FIG. 8C, the control voltage applied to the control voltage device Pc is increased to the higher V2 of the programming voltages (from either the first programming voltage V1 or circuit reference potential), while the other electrodes all remain at the first programming voltage V1. Fourth, as shown in FIG. 8D, the voltage at the write signal electrode of the write control device Pw is returned to circuit reference potential, while the control voltage electrode remains at the higher programming voltage V2 and the other electrodes remain at the first programming voltage V1. This results in the desired programming effect for the selected cells. For the unselected cells, i.e., those memory cells whose programming is not to be changed, the write signal electrode Dp remains at the first programming voltage V1 as shown in FIG. 8C.

Figure 8E:
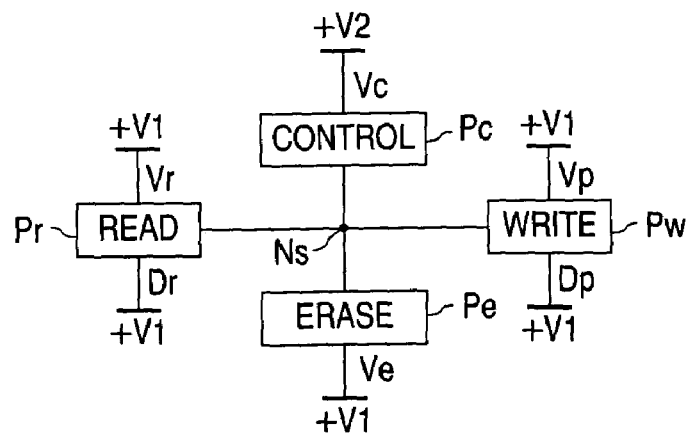
Figure 8F:
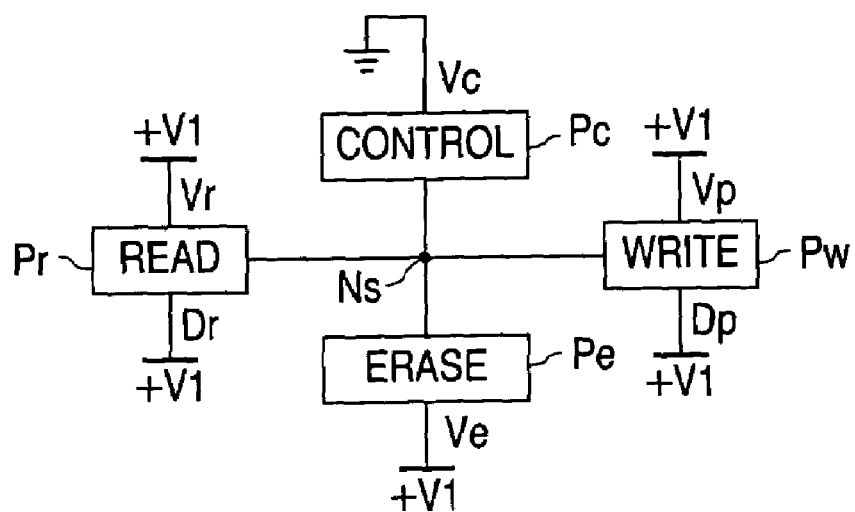
Figure 8G:
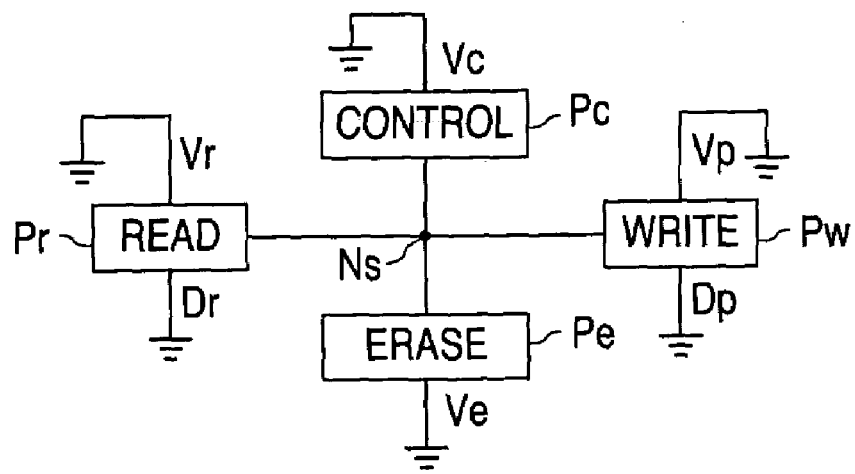

Fifth, as shown in FIG. 8E, the write signal electrode of the write control device Pw is returned to the first programming voltage V1, while the control voltage applied to the control voltage device Pc remains at the second programming voltage V2 and the other electrodes remain at the first programming voltage V1. Sixth, as shown in FIG. 8F, the control voltage electrode of the control voltage control device Pc is returned to circuit reference potential, while the other electrodes all remain at the first programming voltage V1. Seventh, as shown in FIG. 8G, all electrodes previously having the first programming voltage V1 applied are returned to circuit reference potential.

Based upon the foregoing, it should be understood that such a programming method prevents unselected cells from undergoing programming, while also preventing selected cells from going into regular mode with high drain currents. Such method also prevents parasitic programming or erasing through the erase Pe and read Pr devices.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of selectively programming first and second memory cells each of which includes a plurality of P-channel insulated gate field effect transistors (P-IGFETs), each having a gate, a drain, a source and an N-well, wherein each one of the first and second memory cells includes a control P-IGFET with a control electrode connecting its drain, source and N-well, a write P-IGFET with a write electrode connecting its source and N-well, a read P-IGFET with a read electrode connecting its source and N-well, an erase P-IGFET with an erase electrode connecting its drain, source and N-well, and a shared electrode connecting the control, write, read and erase P-IGFET gates, the method comprising:

applying a substantially fixed reference voltage to said control electrodes, said write P-IGFET drains, said write electrodes, said read P-IGFET drains, said read electrodes and said erase electrodes of said first and second memory cells;

applying to at least said write P-IGFET drains, said write electrodes, said read P-IGFET drains, said read electrodes and said erase electrodes of said first and second memory cells a first substantially fixed programming voltage which is more positive than said reference voltage;

applying to said control electrodes of said first and second memory cells a second substantially fixed programming voltage which is more positive than said first substantially fixed programming voltage;

re-applying said substantially fixed reference voltage to said write P-IGFET drain of said first memory cell while continuing said applying of said first substantially fixed programming voltage to said write P-IGFET drain of said second memory cell;

re-applying said first substantially fixed programming voltage to said write P-IGFET drain of said first memory cell;

re-applying said substantially fixed reference voltage to said control electrodes of said first and second memory cells; and re-applying said substantially fixed reference voltage to said write P-IGFET drains, said write electrodes, said read P-IGFET drains, said read electrodes and said erase electrodes of said first and second memory cells.

2. A method of selectively programming first and second memory cells each of which includes a plurality of P-channel insulated gate field effect transistors (P-IGFETs), each having a gate, a drain, a source and an N-well, wherein each one of said first and second memory cells includes a control capacitor with first and second electrodes, a write P-IGFET with a write electrode connecting its source and N-well, a read P-IGFET with a read electrode connecting its source and N-well, an erase P-IGFET with an erase electrode connecting its drain, source and N-well, and a shared electrode connecting said first control capacitor electrode and said write, read and erase P-IGFET gates, said method comprising:

applying a substantially fixed reference voltage to said second control capacitor electrodes, said write P-IGFET drains, said write electrodes, said read P-IGFET drains, said read electrodes and said erase electrodes of said first and second memory cells;

applying to at least said write P-IGFET drains, said write electrodes, said read P-IGFET drains, said read electrodes and said erase electrodes of said first and second memory cells a first substantially fixed programming voltage which is more positive than said reference voltage;

applying to said second control capacitor electrodes of said first and second memory cells a second substantially fixed programming voltage which is more positive than said first substantially fixed programming voltage;

re-applying said substantially fixed reference voltage to said write P-IGFET drain of said first memory cell while continuing said applying of said first substantially fixed programming voltage to said write P-IGFET drain of said second memory cell;

re-applying said first substantially fixed programming voltage to said write P-IGFET drain of said first memory cell;

re-applying said substantially fixed reference voltage to said second control capacitor electrodes of said first and second memory cells; and re-applying said substantially fixed reference voltage to said write P-IGFET drains, said write electrodes, said read P-IGFET drains, said read electrodes and said erase electrodes of said first and second memory cells.

3. A method of selectively programming first and second memory cells each of which includes a plurality of P-channel insulated gate field effect transistors (P-IGFETs), each having a gate, a drain, a source and an N-well, wherein each one of said first and second memory cells includes a gated diode with a gate, an anode and a cathode, a control P-IGFET with a control electrode connecting its drain, source and N-well, a read P-IGFET with a read electrode connecting its source and N-well, an erase P-IGFET with an erase electrode connecting its drain, source and N-well, and a shared electrode connecting said gated diode gate and said control, read and erase P-IGFET gates, said method comprising:

applying a substantially fixed reference voltage to said control electrodes, said gated diode anodes, said gated diode cathodes, said write electrodes, said read P-IGFET drains, said read electrodes and said erase electrodes of said first and second memory cells;

applying to at least said gated diode anodes, said gated diode cathodes, said read P-IGFET drains, said read electrodes and said erase electrodes of said first and second memory cells a first substantially fixed programming voltage which is more positive than said reference voltage;

applying to said control electrodes of said first and second memory cells a second substantially fixed programming voltage which is more positive than said first substantially fixed programming voltage;

re-applying said substantially fixed reference voltage to said gated diode anode of said first memory cell while continuing said applying of said first substantially fixed programming voltage to said gated diode anode of said second memory cell;

re-applying said first substantially fixed programming voltage to said gated diode anode of said first memory cell;

re-applying said substantially fixed reference voltage to said control electrodes of said first and second memory cells; and re-applying said substantially fixed reference voltage to said gated diode anodes, said gated diode cathodes, said read P-IGFET drains, said read electrodes and said erase electrodes of said first and second memory cells.

4. A method of selectively programming first and second memory cells each of which includes a plurality of P-channel insulated gate field effect transistors (P-IGFETs), each having a gate, a drain, a source and an N-well, wherein each one of said first and second memory cells includes a control capacitor with first and second electrodes, a gated diode with a gate, an anode and a cathode, a read P-IGFET with a read electrode connecting its source and N-well, an erase P-IGFET with an erase electrode connecting its drain, source and N-well, and a shared electrode connecting said first control capacitor electrode, said gated diode gate, and said read and erase P-IGFET gates, said method comprising:

applying a substantially fixed reference voltage to said second control capacitor electrodes, said gated diode anodes, said gated diode cathodes, said read P-IGFET drains, said read electrodes and said erase electrodes of said first and second memory cells;

applying to at least said gated diode anodes, said gated diode cathodes, said read P-IGFET drains, said read electrodes and said erase electrodes of said first and second memory cells a first substantially fixed programming voltage which is more positive than said reference voltage;

applying to said second control capacitor electrodes of said first and second memory cells a second substantially fixed programming voltage which is more positive than said first substantially fixed programming voltage;

re-applying said substantially fixed reference voltage to said gated diode anode of said first memory cell while continuing said applying of said first substantially fixed programming voltage to said gated diode anode of said second memory cell;

re-applying said first substantially fixed programming voltage to said gated diode anode of said first memory cell;

re-applying said substantially fixed reference voltage to said control electrodes of said first and second memory cells; and re-applying said substantially fixed reference voltage to said gated diode anodes, said gated diode cathodes, said read P-IGFET drains, said read electrodes and said erase electrodes of said first and second memory cells.

* * * * *